United States Patent
Eklund et al.

(10) Patent No.: US 11,837,658 B1
(45) Date of Patent: Dec. 5, 2023

(54) SEMICONDUCTOR DEVICE COMPRISING A LATERAL SUPER JUNCTION FIELD EFFECT TRANSISTOR

(71) Applicant: K. EKLUND INNOVATION, Uppsala (SE)

(72) Inventors: Klas-Håkan Eklund, Uppsala (SE); Lars Vestling, Södertälje (SE)

(73) Assignee: K. EKLUND INNOVATION, Uppsala (SE)

( * ) Notice: Subject to any disclaimer, the term of this patent is extended or adjusted under 35 U.S.C. 154(b) by 0 days.

(21) Appl. No.: 17/845,789

(22) Filed: Jun. 21, 2022

(51) Int. Cl.
*H01L 29/78* (2006.01)
*H01L 29/66* (2006.01)

(52) U.S. Cl.
CPC .... *H01L 29/7832* (2013.01); *H01L 29/66893* (2013.01); *H01L 29/7825* (2013.01)

(58) Field of Classification Search
None
See application file for complete search history.

(56) References Cited

U.S. PATENT DOCUMENTS

| | | | |
|---|---|---|---|
| 11,031,480 B2 | 6/2021 | Eklund et al. | |
| 2002/0105024 A1* | 8/2002 | Fujihira | H01L 29/7835 257/E29.279 |
| 2003/0054598 A1* | 3/2003 | Disney | H01L 29/66681 257/E29.136 |
| 2003/0057479 A1* | 3/2003 | Ahlers | H01L 29/7801 257/E29.313 |
| 2003/0168704 A1* | 9/2003 | Harada | H01L 29/1066 257/E29.104 |
| 2011/0127586 A1* | 6/2011 | Bobde | H01L 29/7817 438/192 |
| 2011/0127606 A1 | 6/2011 | Bobde et al. | |
| 2017/0222043 A1* | 8/2017 | Hirler | H01L 29/0847 |
| 2019/0198609 A1* | 6/2019 | Weis | H01L 29/7823 |
| 2020/0105742 A1* | 4/2020 | Eklund | H01L 29/7394 |
| 2020/0303513 A1* | 9/2020 | Bobde | H01L 29/66901 |
| 2021/0288187 A1* | 9/2021 | Reznicek | H01L 29/66901 |

\* cited by examiner

*Primary Examiner* — Khaja Ahmad
(74) *Attorney, Agent, or Firm* — NIXON & VANDERHYE

(57) ABSTRACT

Disclosed is a semiconductor device, including: a substrate of a first conductivity type that is a base for the semiconductor device; a high voltage junction field effect transistor, JFET, over the substrate, wherein the JFET including a plurality of parallel conductive layers; and a first conductive layer of the second conductivity type of the parallel conductive layers stretching over the substrate. On top of the first conductive layer of the second conductivity type is arranged a plurality of layers forming the parallel conductive layers with channels formed by a plurality of doped epitaxial layers of the second conductivity type with a plurality of gate layers of the first conductivity type on both sides thereof; wherein a lowermost layer of the first conductivity type is arranged in the form of consecutive dots with different lengths and distances between them.

20 Claims, 2 Drawing Sheets

SEMICONDUCTOR DEVICE COMPRISING A LATERAL SUPER JUNCTION FIELD EFFECT TRANSISTOR

BACKGROUND OF THE INVENTION

Field of the Invention

The present invention relates to a semiconductor device comprising a lateral super junction field effect transistor, JFET, that can be implemented by placing a plurality of alternating n- and p-type layers on top of each other and connecting them in parallel.

Description of the Related Art

Such devices have previously been described in many patent documents, e.g. in U.S. Pat. No. 11,031,480 B2, US 2019/0198609 A1, US 2017/0222043 A1, and US 2011/0127606 A1.

The stack of alternating n- and p-layers will, if they are matched in charge, completely deplete each other and a uniform electric field can be formed in the material with almost optimal use of the material in terms of breakdown voltage. The stack of alternating n- and players needs to be terminated at the bottom and the field needs to turn 90 degrees since the substrate is grounded and have constant potential along the whole drift region. This will increase the electric field locally and this increase in field will induce an electric breakdown lower than the breakdown in the stack. Several different attempts to shape the electric field have been demonstrated.

US 2011/0127606 A1 suggests an n-buffer layer (160) that is located under the bottom channel all the way between the source and drain, or partially (160-1) between the source and drain. Another suggestion is to place a floating n+ region (661) in the substrate under the drain to shield the drain from the high field.

US 2017/0222043 A1 suggests a diffused p-region (253) and/or a diffused n-region (252) under the source and drain respectively, also to shape the electric field and decrease the maximum electric field.

US 2019/0198609 A1 suggests a region (202) with linear or non-linear increasing thickness going from the source to the drain. This is also with the intention to shape the electric field.

The stack of n- and p-layers is previously demonstrated in several places in the above cited documents. Normally the bottom channel is abruptly ended at the drain and under the channel the substrate is acting as a bottom gate and also a substrate that should support the breakdown voltage of the device. In the channels the electric field is perfectly lateral but under the drain it has to turn to a vertical field since the backside is grounded. This means that the field has to turn 90 degrees under the bottom channel in the substrate. If nothing is done, the electric field profile from source to drain will form a U-shape with highest field near the drain. The U-shape means that the field is not uniformly distributed, and the breakdown voltage will be lower than is possible.

SUMMARY OF THE INVENTION

The object of the present invention is to reduce the above drawbacks and to obtaining a higher breakdown voltage.

This object is obtained by the device according to the present invention, where a lowermost layer of the first conductivity type is arranged in the form of consecutive dots with different lengths and distances between deep polycrystalline trenches of the second conductivity type in the bottom part of the JFET.

Further improvements can be obtained through the devices defined in the dependent claims.

BRIEF DESCRIPTION OF THE DRAWINGS

The invention will now be explained with the help of a couple of non-limiting embodiments of a semiconductor device, focusing on the JFET part as shown on the accompanying drawings, in which.

DESCRIPTION OF THE PREFERRED EMBODIMENTS

Figure 1:
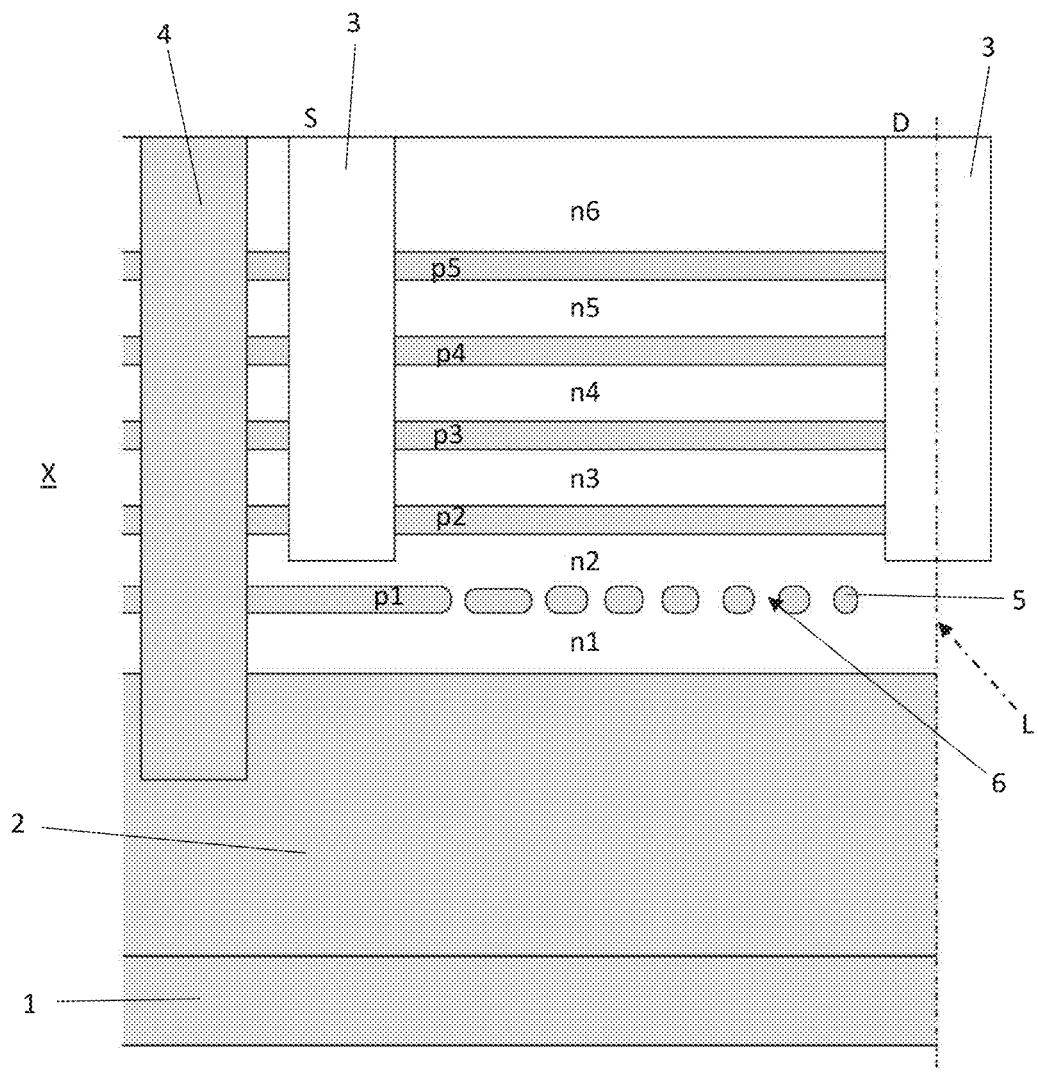
FIG. 1 shows a first embodiment of the invention.

FIG. 1. shows the invention, starting with a highly doped substrate 1 of first conductivity type which is connected to a grounded back contact. On the substrate is a thick, low-doped layer 2 of first conductivity type epitaxially grown. The thickness of the epitaxial layer should be large enough to support the breakdown voltage of the device. On the low-doped layer 2 of first conductivity type is a layer n1 of second conductivity type epitaxially grown. On the epitaxial layer n1 is an implantation mask placed and ion implantation is done forming a masked layer p1 of first conductivity type. By partitioning the layer and varying the lengths and distances of the resulting p-regions in the masked layer of first conductivity type p1, the effective amount of charges of first conductivity type will decrease towards to the drain side D of the structure. This will decrease the electric field near drain and thus a more uniform electric field is achieved and a higher breakdown voltage. On top of the structure is now an epitaxial layer of second conductivity type n2 placed and a first gate of the first conductivity type is either implanted or epitaxially grown on the channel n2. These two layers are then repeated upwards as demonstrated in several earlier publications, e.g. in the above cited patent documents.

From the surface are deep trenches etched and then filled with highly doped silicon. In the figure is shown two filled trenches 3 that are of second conductivity type and connecting the channels of second conductivity type n2-n6. The filled trench 4 of first conductivity type is used to connect the layers of first conductivity type p1-p5. The gates p2-p5 are connected to ground in the third dimension, for example by making interruptions in the source trench as demonstrated in U.S. Pat. No. 11,031,480 B2, or by making filled trench pillars of first conductivity type as shown in US 2019/0198609 A1 and US 2017/0222043 A1.

A semiconductor device according to the invention can be combined with a further isolated region X arranged over the substrate, comprising logics and analogue control functions, isolated with deep polycrystalline trenches of the first conductivity type 4, on both sides thereof, to the left of the parts shown in the figure. Such a semiconductor device is e.g. described in U.S. Pat. No. 11,031,480 B2.

Preferably the consecutive dots 5 of different lengths have decreasing lengths in direction towards the drain side D of the structure, and the distances 6 between the dots 5 increase in the direction towards the drain side D of the structure.

The whole structure is mirrored around the line of symmetry L which allows for high voltage on the drain trench.

Figure 2:
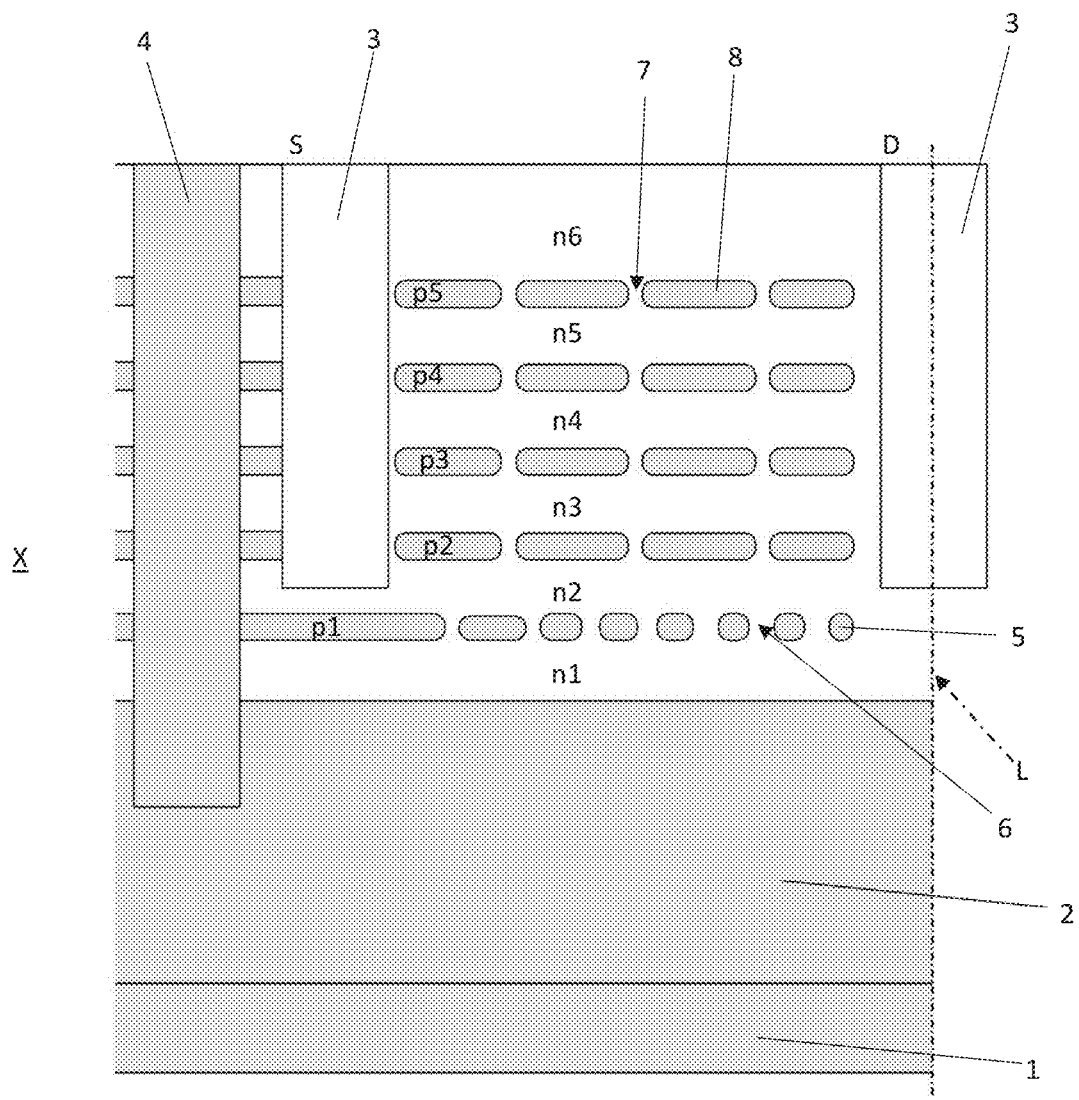
FIG. 2 shows a second embodiment of a further development of the invention.

FIG. 2 shows a modified device where the gate layers p2-p5 are made with ion implantation through a photoresist mask creating interruptions 7 in the layers p2-p5 of first conductivity type. In the interruptions the doping is the same as in the adjacent channel regions n2-n5 of second conductivity type. The interruptions 7 are evenly distributed along the drift region. The interruptions 7 in the layer will divide the region in several shorter regions 8 of first conductivity type. The leftmost region of the shorter regions is connected to the ground as described earlier and the other regions are floating. For small drain voltages the floating regions of first conductivity type will deplete the channel region less than a long p-gate which is grounded along the whole drift region. This will increase the current through the device for low drain voltages. For higher voltages a current will flow through the shorter regions and connecting them together.

For this to happen the length of the interruptions 7 should not be too large. E.g. the distance 7 between the regions 8 can be about 0.3 µm, and the length of the regions 8 can be about 5 µm.

In the drawings the device according to the invention has been described when the first conductivity type is p-type, and the second conductivity type is n-type. However, the device according to the invention can also be implemented so that the first conductivity type is n-type, and the second conductivity type is p-type.

The invention claimed is:

1. A semiconductor device, comprising:
   a substrate of a first conductivity type that is a base for the semiconductor device;
   a high voltage junction field effect transistor, JFET, over the substrate, wherein the JFET comprising a plurality of parallel conductive layers, the JFET being isolated with a deep polycrystalline trench of a first conductivity type on a source side of the JFET;
   a first conductive layer of the second conductivity type of the parallel conductive layers stretching over the substrate;
   wherein on top of the first conductive layer of the second conductivity type is arranged a plurality of layers forming the parallel conductive layers with channels formed by a plurality of doped epitaxial layers of the second conductivity type with a plurality of gate layers of the first conductivity type on both sides thereof;
   wherein,
   a lowermost layer of the first conductivity type is arranged in the form of consecutive dots with different lengths and distances between them.

2. A semiconductor device according to claim 1, wherein
   the consecutive dots of different lengths have decreasing lengths in direction towards the drain side of the structure, and the distances between the dots increase in the direction towards the drain side of the structure.

3. A semiconductor device according to claim 1, wherein the conductive layers of the first conductivity type above the first conductive layer of the first conductive type are comprised of consecutive regions with different lengths and distances between each of the regions and the deep polycrystalline trenches of the second conductivity type.

4. A semiconductor device according to claim 1, wherein a further isolated region is arranged over the substrate, comprising logics and analogue control functions, isolated with deep polycrystalline trenches of the first conductivity type on both sides thereof.

5. A semiconductor device according to claim 1, wherein the first conductivity type is p-type and the second conductivity type is n-type.

6. A semiconductor device according to claim 1, wherein the first conductivity type is n-type and the second conductivity type is p-type.

7. A semiconductor device according to claim 2, wherein the conductive layers of the first conductivity type above the first conductive layer of the first conductive type are comprised of consecutive regions with different lengths and distances between each of the regions and the deep polycrystalline trenches of the second conductivity type.

8. A semiconductor device according to claim 2, wherein a further isolated region is arranged over the substrate, comprising logics and analogue control functions, isolated with deep polycrystalline trenches of the first conductivity type on both sides thereof.

9. A semiconductor device according to claim 3, wherein a further isolated region is arranged over the substrate, comprising logics and analogue control functions, isolated with deep polycrystalline trenches of the first conductivity type on both sides thereof.

10. A semiconductor device according to claim 7, wherein a further isolated region is arranged over the substrate, comprising logics and analogue control functions, isolated with deep polycrystalline trenches of the first conductivity type on both sides thereof.

11. A semiconductor device according to claim 2, wherein the first conductivity type is p-type and the second conductivity type is n-type.

12. A semiconductor device according to claim 3, wherein the first conductivity type is p-type and the second conductivity type is n-type.

13. A semiconductor device according to claim 4, wherein the first conductivity type is p-type and the second conductivity type is n-type.

14. A semiconductor device according to claim 7, wherein the first conductivity type is p-type and the second conductivity type is n-type.

15. A semiconductor device according to claim 8, wherein the first conductivity type is p-type and the second conductivity type is n-type.

16. A semiconductor device according to claim 9, wherein the first conductivity type is p-type and the second conductivity type is n-type.

17. A semiconductor device according to claim 10, wherein the first conductivity type is p-type and the second conductivity type is n-type.

18. A semiconductor device according to claim 2, wherein the first conductivity type is n-type and the second conductivity type is p-type.

19. A semiconductor device according to claim 3, wherein the first conductivity type is n-type and the second conductivity type is p-type.

20. A semiconductor device according to claim 4, wherein the first conductivity type is n-type and the second conductivity type is p-type.

* * * * *